United States Patent
Koo et al.

(10) Patent No.: US 7,235,850 B2
(45) Date of Patent: Jun. 26, 2007

(54) THIN FILM TRANSISTOR, METHOD OF FABRICATING THE SAME, AND FLAT PANEL DISPLAY USING THIN FILM TRANSISTOR

(75) Inventors: Jae-Bon Koo, Yongin-si (KR); Sang-Gul Lee, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/992,131

(22) Filed: Nov. 19, 2004

(65) Prior Publication Data

US 2005/0110084 A1 May 26, 2005

(30) Foreign Application Priority Data

Nov. 25, 2003 (KR) ............... 10-2003-0084241

(51) Int. Cl.
*H01L 29/786* (2006.01)
(52) U.S. Cl. ............ 257/408; 257/291; 257/336; 257/E31.126; 257/E29.117; 438/151; 438/163
(58) Field of Classification Search ........ 257/E51.005, 257/E31.126, E27.116, E27.117, 57, 43, 257/408; 438/163
See application file for complete search history.

(56) References Cited

U.S. PATENT DOCUMENTS

| 5,308,998 | A | * | 5/1994 | Yamazaki et al. | ............ 257/57 |
| 5,430,320 | A | * | 7/1995 | Lee | ............ 257/412 |
| 5,612,234 | A | * | 3/1997 | Ha | ............ 438/163 |
| 6,562,671 | B2 | | 5/2003 | Ohnuma | |
| 2002/0142554 | A1 | * | 10/2002 | Nakajima | ............ 438/301 |
| 2004/0089878 | A1 | * | 5/2004 | Takehashi et al. | ............ 257/200 |

FOREIGN PATENT DOCUMENTS

| JP | 07-226515 | 8/1995 |
| JP | 10-200121 | 7/1998 |
| JP | 2004-349604 | 12/2004 |
| KR | 10-1998-0032842 | 7/1998 |

* cited by examiner

*Primary Examiner*—Jerome Jackson
*Assistant Examiner*—Paul Budd
(74) *Attorney, Agent, or Firm*—H.C. Park & Associates, PLC

(57) ABSTRACT

A thin film transistor may include an active layer formed on an insulating substrate and formed with source/drain regions and a channel region; a gate insulating film formed on the active layer; and a gate electrode formed on the gate insulating film. The gate electrode may be formed of a conductive metal film pattern and a conductive oxide film covering the conductive metal film pattern. The source/drain regions may include an LDD region, and the LDD region may at least partially overlap with the gate electrode.

11 Claims, 7 Drawing Sheets

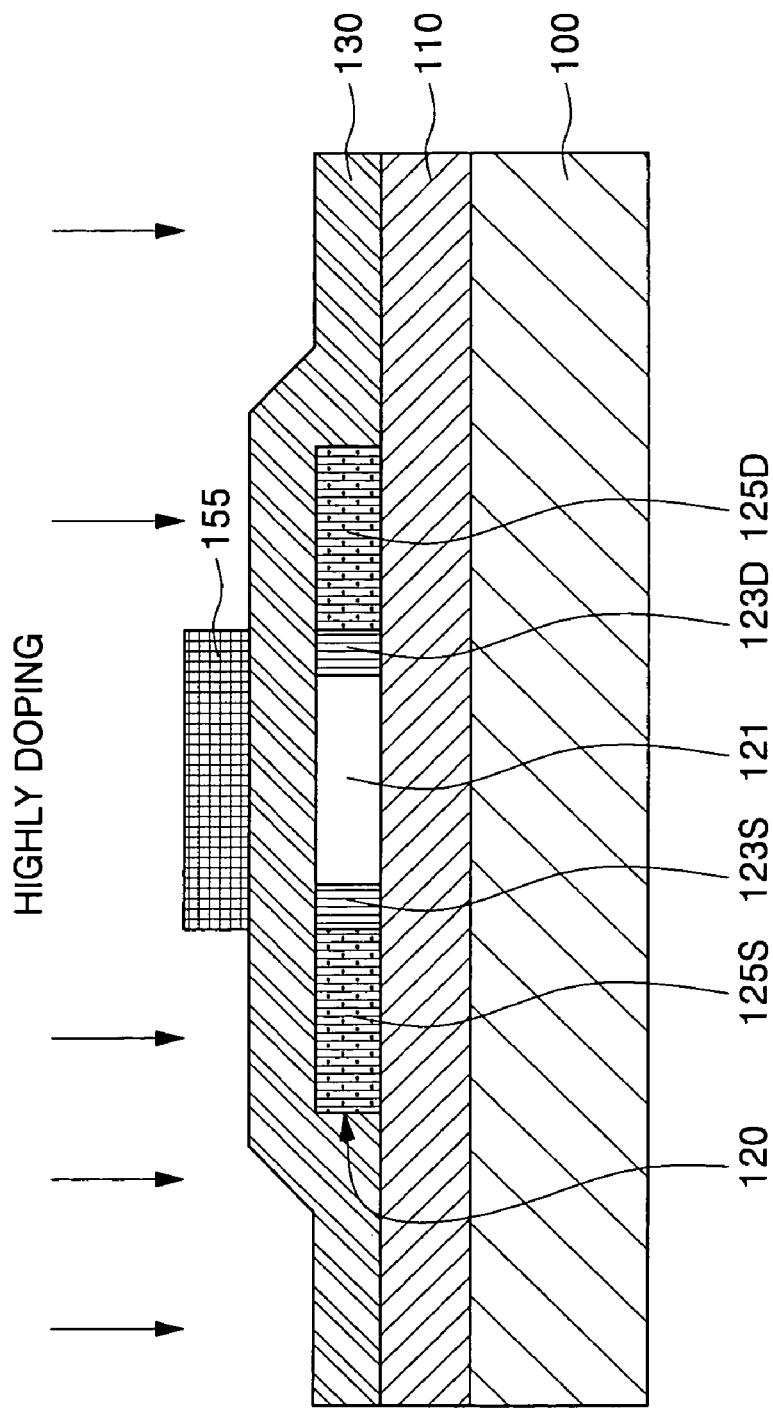

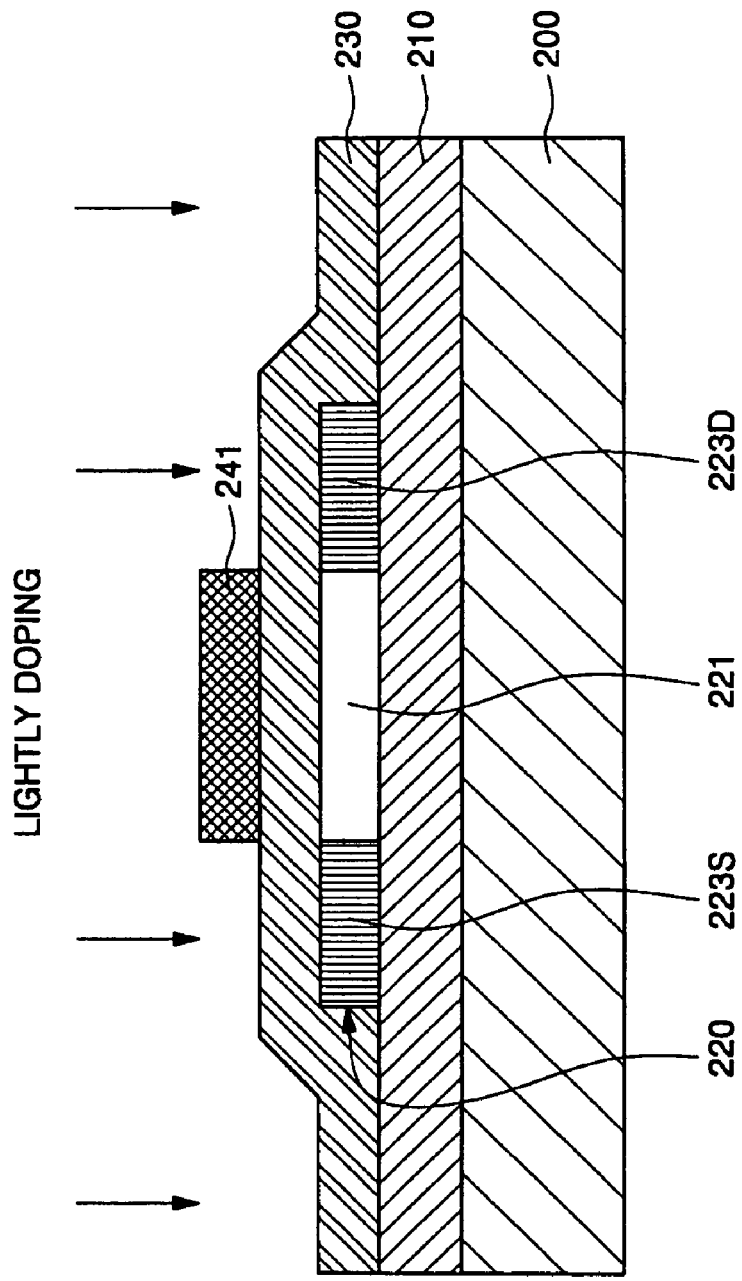

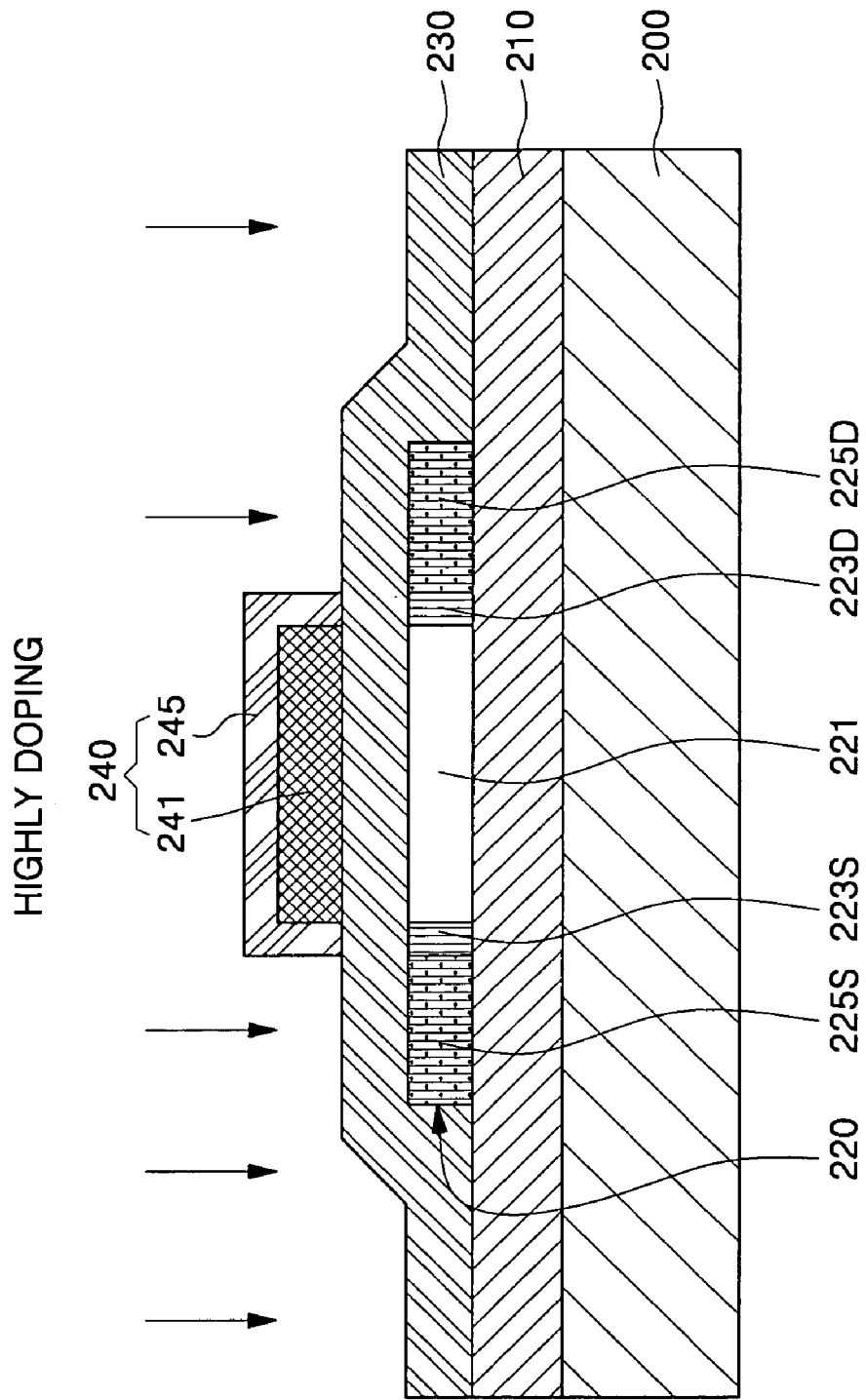

THIN FILM TRANSISTOR, METHOD OF FABRICATING THE SAME, AND FLAT PANEL DISPLAY USING THIN FILM TRANSISTOR

CROSS-REFERENCE TO RELATED APPLICATION

This application claims the benefit of Korea Patent Application No. 2003-84241 filed on Nov. 25, 2003, disclosure of which is hereby incorporated herein by reference in its entirety.

BACKGROUND OF THE INVENTION

1. Field of the Invention

The present invention relates to a thin film transistor (TFT), a method of fabricating the same and a flat panel display using the TFT. More particularly, the invention relates to a TFT having a gate overlapped lightly doped drain (GOLDD) structure, a method of fabricating the same and a flat panel display using the TFT.

2. Description of the Related Art

An active-matrix flat panel display can use a TFT as a switching element. TFTs may be used, for example, as pixel-driving TFTs formed in each pixel and driving the pixels, and as driving-circuit TFTs driving the pixel-driving TFTs and transmitting a signal to a scan line (gate line) and a signal line (data line).

Among various TFTs, a polycrystalline silicon TFT can be fabricated at a temperature similar to that for fabricating an amorphous silicon TFT due to technological advances. In particular the advance of crystallization technology using lasers may permit this relatively low temperature fabrication of TFTs. Polycrystalline silicon may allow electrons or holes to have high mobility as compared with amorphous silicon in a TFT. It thus may be possible to realize an improved complementary metal-oxide semiconductor (CMOS) TFT having n- and p-channels. Accordingly, polycrystalline silicon can be used to form pixel-driving TFTs and driving-circuit TFTs on large-sized insulating substrates.

In a polycrystalline silicon CMOS TFT, an n-channel metal oxide semiconductor (NMOS) TFT generally uses phosphorus (P) as a dopant. Phosphorus (P) has an atomic weight greater than boron (B): the dopant generally used in a p-channel metal oxide semiconductor (PMOS) TFT. One reason for this choice is so that a silicon crystal lattice thereof is less likely to become damaged at a predetermined region and remain unrecovered in a sequential activating process.

Such damaged region decreases the mobility of electrons. This decrease in electron flow into a gate insulating film or a metal-oxide semiconductor (MOS) interface, when the electron is accelerated from a source region to a drain region, is called hot carrier stress. Therefore, the damaged region may have a deleterious effect on circuit operation of the flat display panel, and may increase the off-current.

To solve the foregoing problems, various structures such as an off-set structure, a lightly doped drain (LDD) structure, and the like have been proposed. In the case of the off-set structure, an off-set region may be provided to form an imperfect doping region on a predetermined region between the gate and the source/drain regions, so that an electric field applied to a junction area is reduced by great resistance due to the off-set region, thereby decreasing the off-current. In the case of the LDD structure, an LDD is formed by lowering the doping concentration applied to a predetermined region between the source and drain regions, so that the off-current is decreased and the reduction of the on-current is minimized.

However, as low temperature poly silicon (LTPS) technology is highly integrated, the conventional off-set and LDD structures provide limited enhancement to the reliability of a short channel device. One way to overcome that limit may be to implement a thin film transistor with a gate overlapped lightly doped drain (GOLDD) structure.

FIGS. 1A, 1B, 1C, and 1D are cross-sectional views for illustrating a fabrication process of a conventional thin film transistor with a GOLDD structure.

As shown in FIG. 1A, a buffer layer 110 may be formed on an insulating substrate 100. Then an amorphous silicon film may be deposited on the buffer layer 110 and crystallized into a polycrystalline silicon film. Thereafter, an active layer 120 may be formed by patterning the polycrystalline silicon film.

After forming the active layer 120, a gate insulating film 130 may be formed on a substantial portion of an entire surface of the insulating substrate 100 formed with the active layer 120.

After forming the gate insulating film 130, a first photoresist pattern 140 may be formed for doping low-concentration impurities having a predetermined conductive type (i.e., for LDD doping).

After the first photoresist pattern 140 is formed, the low-concentration impurities may be doped using the first photoresist pattern 140 as a mask, so that low-concentration source/drain regions 123S, 123D may be formed on the active layer 120. A region between the low-concentration source/drain regions 123S and 123D may be used as a channel region 121 of the TFT.

As shown in FIG. 1B, after forming the low-concentration source/drain regions 123S, 123D on the active layer 120 through the light doping, the first photoresist pattern 140 may be removed, and a gate electrode material film 150 may be formed on the gate insulating film 130. Then, a second photoresist pattern 160 is formed for forming a gate electrode.

Here, the second photoresist pattern 160 is formed, partially overlapping with the low-concentration source/drain regions 123S and 123D. Further, the width of the overlapped region is limited to a minimum of about 0.5 μm or more depending on resolution of a stepper.

As shown in FIG. 1C, a gate electrode 155 may be formed by patterning the gate electrode material film 150 using the second photoresist pattern 160 as the mask. In this situation, the gate electrode 155 may be formed partially overlapping the respective low-concentration source/drain regions 123S and 123D due to the second photoresist pattern 160.

After forming the gate electrode 155 to overlap with the respective low-concentration source/drain regions 123S and 123D, high-concentration impurities may be doped onto the active layer 120 through the gate electrode 155 used as the mask, thereby forming high-concentration source/drain regions 125S and 125D.

As shown in FIG. 1D, an interlayer insulating film 170 having contact holes 171, 175 through which the high-concentration source/drain regions 125S, 125D are partially exposed is formed on the entire surface of the insulating substrate 100 with the gate electrode 155. Then, source/drain electrodes 181, 185 are formed to be electrically connected to the high-concentration source/drain regions 125S, 125D through the contact holes 171, 175, thereby finally forming a thin film transistor with the GOLDD structure.

However, in a conventional thin film transistor with GOLDD structure, it may be difficult to reduce the low-concentration source/drain regions overlapping with the gate electrode. That is, it may be difficult to reduce the width of an LDD range to about 0.5 μm or less because of the resolution of the stepper used in the fabrication process.

Further, in a conventional thin film transistor with GOLDD structure, the low-concentration impurities may be doped using a photoresist mask. Then, after the gate electrode is formed, high-concentration impurities may be doped. Thus, an additional mask is needed to dope the low-concentration impurities. Another problem that can occur is that the gate electrode can be defectively aligned.

SUMMARY OF THE INVENTION

The present invention provides a thin film transistor with a GOLDD structure, a method of fabricating the same, and a flat panel display using the same. In an embodiment of the present invention the gate electrode may be formed of a conductive metal film pattern and a conductive oxide film may be formed by oxidizing the conductive metal film pattern. Thus, the width of an LDD region can be easily adjusted and defective alignment of the gate electrode can be prevented.

The present invention separately provides a thin film transistor including an active layer formed on an insulating substrate and having source/drain regions and a channel is region. The TFT also may include a gate insulating film formed on the active layer and a gate electrode formed on the gate insulating film. The gate electrode may be formed of a conductive metal film pattern and a conductive oxide film covering the conductive metal film pattern. In such a TFT the source/drain regions may have LDD regions, and the LDD regions may overlap with the gate electrode.

The present invention also provides a method of fabricating a thin film transistor. This fabrication may include the following steps: forming an active layer on an insulating substrate, forming a gate insulating film on the active layer, forming a conductive metal film pattern on the gate insulating film, performing light doping on the active layer (using the conductive metal film pattern as a mask), forming a gate electrode that includes a conductive metal film pattern and a conductive oxide film formed by oxidizing the conductive metal film pattern and covering the conductive metal film pattern; and forming source/drain regions. The step of forming source/drain regions may be accomplished by highly doping the active layer using the gate electrode as a mask. The source/drain regions may have LDD regions, and the LDD regions may overlap with the gate electrode.

The present invention also provides an active matrix flat panel display or an active matrix organic electroluminescence display, which uses a thin film transistor of the type described in more detail below.

BRIEF DESCRIPTION OF THE DRAWINGS

FIGS. 1A, 1B, 1C, and 1D are cross-sectional views for illustrating the fabrication process of a conventional thin film transistor with a GOLDD structure.

FIGS. 2A, 2B, and 2C are cross-sectional views for illustrating a fabrication process of a thin film transistor with a GOLDD structure according to an embodiment of the present invention.

DETAILED DESCRIPTION OF THE INVENTION

Figure 1A:
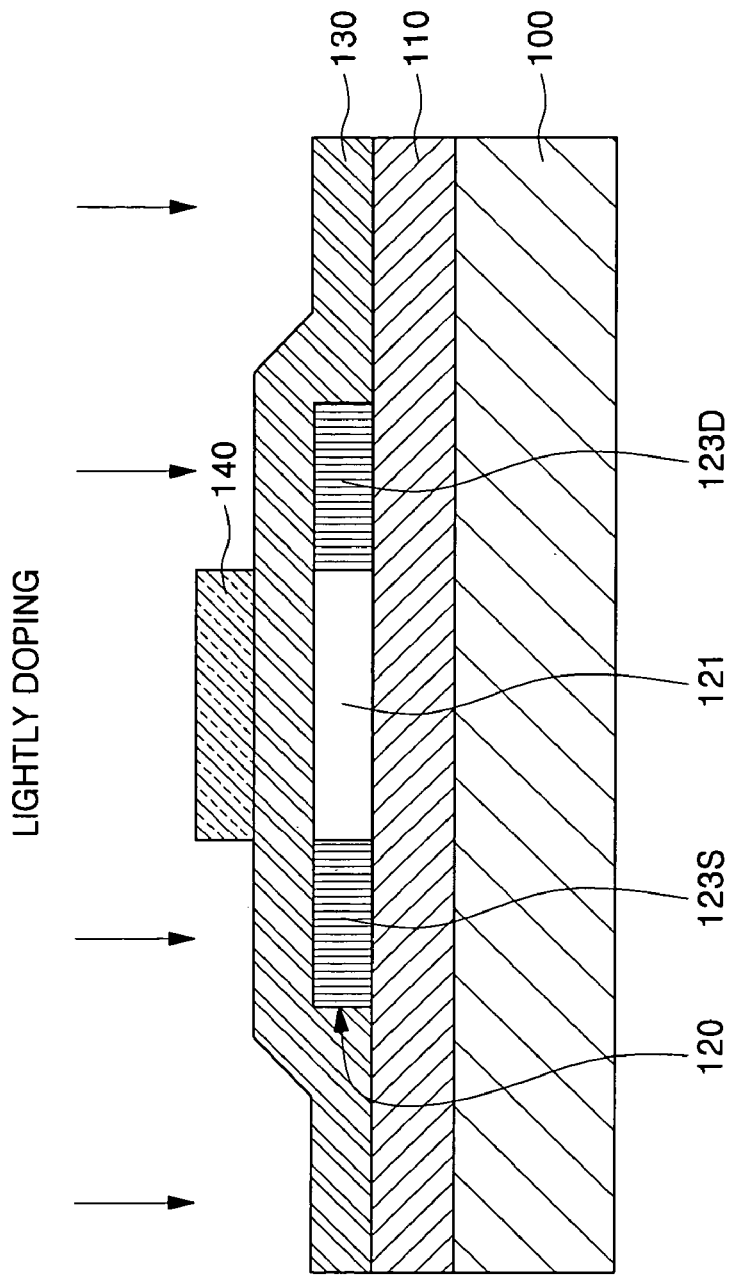
Figure 1B:
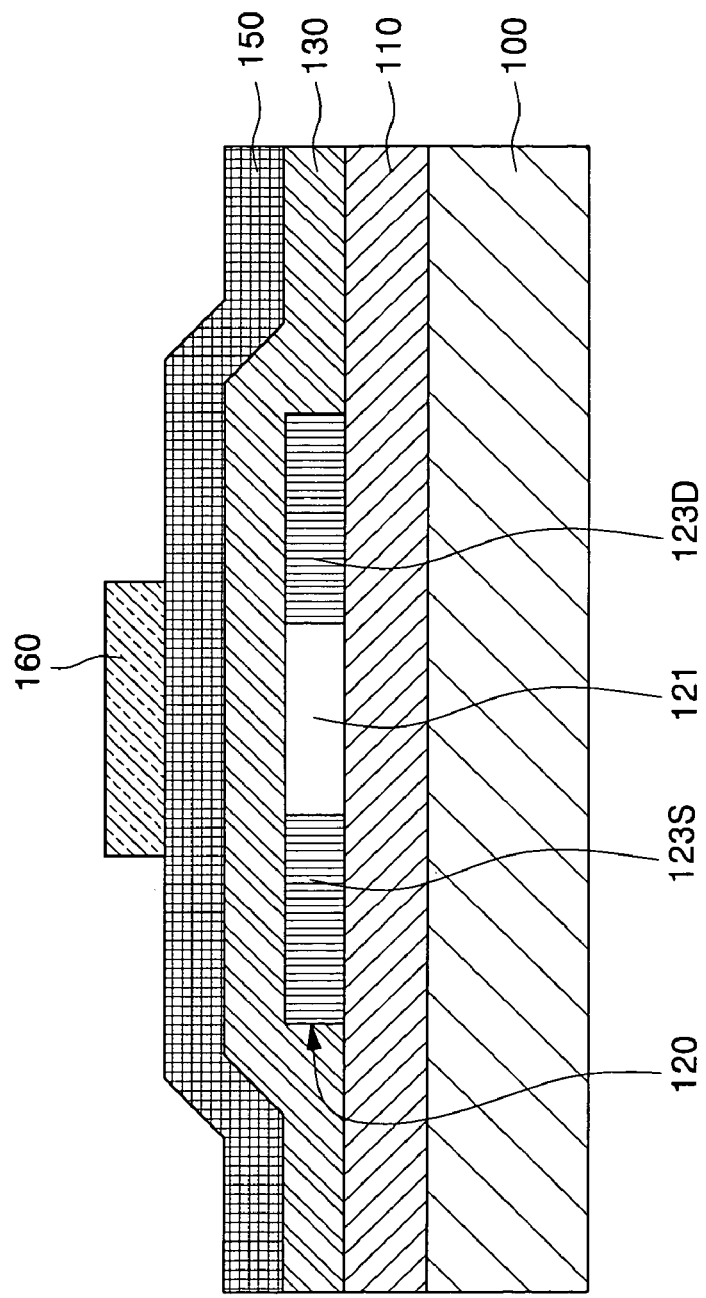
Figure 1D:
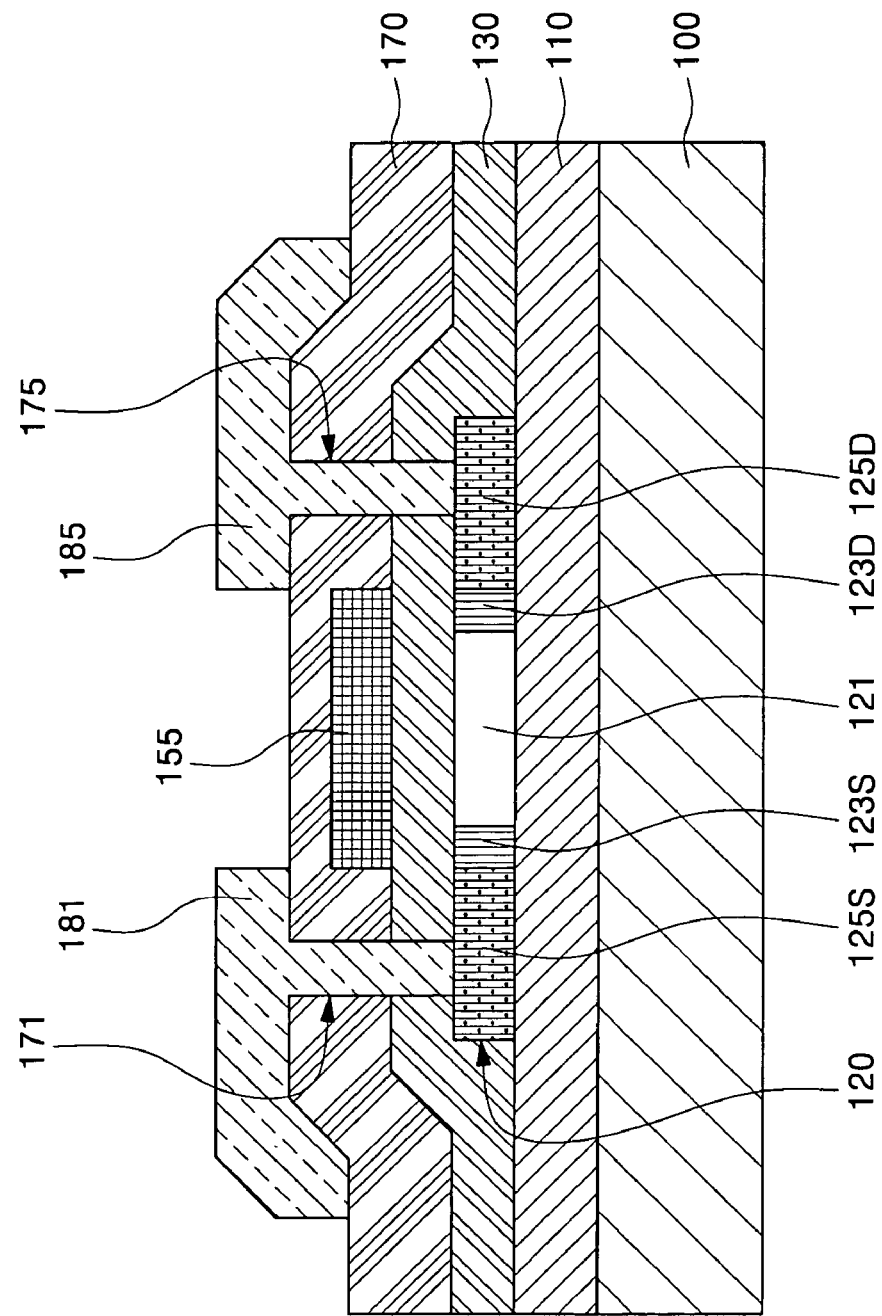

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2C:
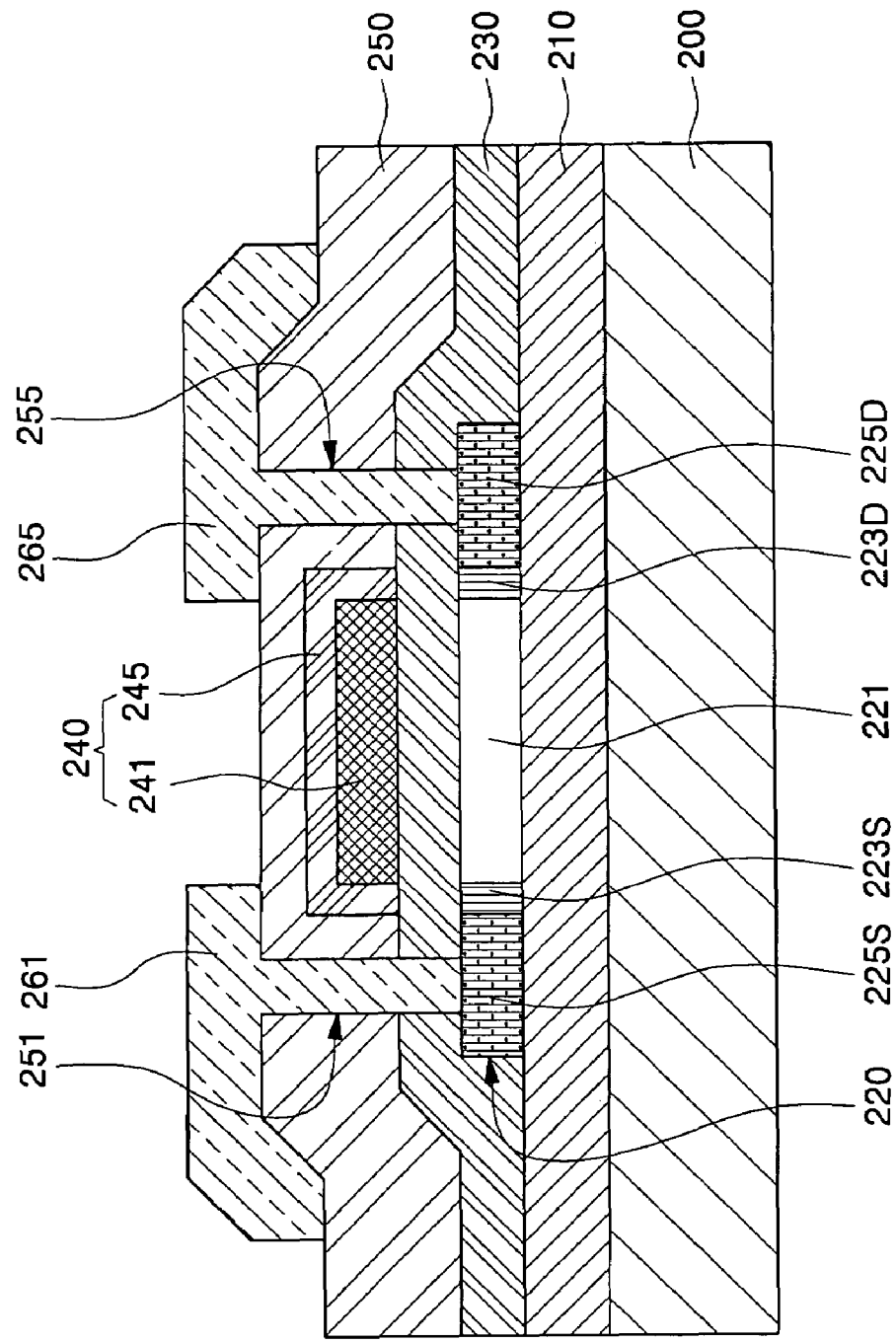

FIGS. 2A to 2C are cross-sectional views for illustrating a fabrication process of a thin film transistor with a GOLDD structure according to an embodiment of the present invention.

A thin film transistor with a GOLDD structure according to an embodiment of the present invention may have a structure in which a gate electrode 240 may be formed of a conductive metal film pattern 241 and a conductive oxide film 245 covering the conductive metal film pattern 241. The gate electrode 240 may overlap with an LDD region that serves as a low-concentration doping region provided in an active layer 220.

As shown in FIG. 2A, a buffer layer (diffusion barrier) 210 may be formed on an insulating substrate 200 by plasma enhanced chemical vapor deposition (PECVD), low-pressure chemical vapor deposition (LPCVD), sputtering, or the like. Such a buffer layer may provide the beneficial effect of preventing impurities such as, for example, metal ions, from being diffused into or otherwise infiltrating the active layer (amorphous silicon).

After forming the buffer layer 210, an amorphous silicon film may be deposited on the buffer layer 210 by PECVD, LPCVD, sputtering method, or the like. Then, a dehydrogenation process may be performed in a vacuum furnace. In the case in which the amorphous silicon film is deposited by sputtering method, the dehydrogenation process may be omitted.

Thereafter, a crystallization process of applying high energy to the amorphous silicon film may be performed to crystallize the amorphous silicon, thereby forming a polycrystalline silicon film. Preferably, excimer laser annealing (ELA), metal induced crystallization (MIC), metal induced lateral crystallization (MILC), sequential lateral solidification (SLS), solid phase crystallization (SPC), or the like can be used as the crystallization process.

After forming the polycrystalline silicon film, an active layer 220 may be formed by patterning the polycrystalline silicon film.

Thereafter, a gate insulating film 230 may be deposited on the active layer 220, and a conductive metal film may be deposited on the gate insulating film 230. Then, a conductive metal film pattern 241 may be formed by patterning the conductive metal film.

Here, the conductive metal film pattern 241 may preferably be made of a material which itself is conductive and whose oxide is also conductive. Particularly, the metal film pattern 241 may be made of Zn, In or an alloy of them. Thus, the conductive oxide film together with the conductive metal film pattern can function as the gate electrode.

After forming the conductive metal film pattern 241, impurities having a predetermined conductive type are lightly doped using the conductive metal film pattern 241 as a mask, that is, a lightly doped drain (LDD) doping is performed using the conductive metal film pattern 241 as the mask, so that low-concentration source/drain regions 223S, 223D are formed. At this time, a region between the low-concentration source/drain regions 223S and 223D forms a channel region 221 of the thin film transistor.

As shown in FIG. 2B after forming the low-concentration source/drain regions 223S, 223D, the conductive metal film pattern 241 is oxidized by a heat treating process. At this time, an exposed portion of the conductive metal film pattern 241 is oxidized and forms the conductive oxide film 245 while being oxidized, thereby forming the gate electrode 240 with the conductive metal film pattern 241 and the conductive oxide film 245.

As the conductive metal film pattern 241 is oxidized, two things may occur. The metal film pattern 241 may shrink a little as conductive metal reacts with oxygen. However, the thickness of the conductive oxide film 245 may increase more than the metal film pattern 241 decreases. Thereby the width of the resultant gate electrode 240 may be more than the width of the conductive metal film pattern 241. Hence, the gate electrode 240 may partially overlap with the low-concentration source/drain regions 223S and 223D.

The conductive oxide film 245 formed at the sides of the conductive metal film pattern 241 preferably may have a thickness of about 2 μm or less, and more preferably of about 1 μm or less. The conductive oxide film 245 together with the conductive metal film pattern 241 may be used as a mask for a subsequent high-concentration doping. These two layers may form the GOLDD structure, thereby determining the low-concentration source/drain regions 223S, 223D. That is, they may control the width of the LDD region.

The thickness of the conductive oxide film 245 may vary depending upon heat treating conditions for the conductive metal film pattern 241, and thus the LDD region (223S, 223D) can have a width of about 2 μm or less in proportion to the thickness of the conductive oxide film 245. In some preferable embodiments, the LDD region (223S, 223D) can have a width of about 1 μm or less.

After the gate electrode 240 is completed (including both the conductive metal film pattern 241 and the conductive oxide film 245), the high doping may be performed on the active layer 220 using the gate electrode 240 as a mask. This doping may thereby form the high-concentration source/drain regions 225S and 225D.

Next, the low-concentration source/drain regions 223S and 223D formed under the conductive oxide film 245 formed at the sides of the conductive metal film pattern 241 may be shielded from being highly doped because of the gate electrode 240. Thus the low-concentration source/drain regions 223S and 223D may remain in the low-concentration doped state and may function as an LDD region. Thus, the gate electrode 240 may overlap with the lightly doped region 223S and 223D (that is, it may overlap with the LDD region), thereby forming the GOLDD structure. Here, the LDD region may be formed beneath the conductive oxide film 245 formed at the sides of the conductive metal film pattern 241.

Further, the width of the LDD region of the GOLDD structure may be determined by the thickness of the conductive oxide film 245 formed at the sides of the conductive metal film pattern 241, so that the width of the LDD region formed overlapping with the gate electrode 240 may be narrower than the thickness of the conductive oxide film 245 formed at the sides of the conductive metal film pattern 241.

As shown in FIG. 2C, after the high-concentration source/drain regions 225S and 225D are formed, an interlayer insulating film 250 may be formed on the entire surface of the insulating substrate 200 and may be patterned to include contact holes 251 and 255 through which the high-concentration source/drain regions 225S and 225D may be partially exposed.

After the contact holes 251 and 255 are formed, a predetermined conductive film may be deposited on the entire surface of the insulating substrate 200 and may be patterned to form source/drain electrodes 261 and 265 that may be electrically connected to the high-concentration source/drain regions 225S and 225D. This may complete the formation of a thin film transistor with the GOLDD structure.

Such a thin film transistor does not require an additional mask for the low-concentration doping. Moreover, in addition to reducing the number of required masks, the manufacturing technique described may also prevent the gate electrode 240 from being defectively aligned.

Also, the GOLDD structure may be formed by means of the conductive oxide film 245 formed by oxidizing the conductive metal film pattern 241. Thus the width of the LDD region can be adjusted by the thickness of the conductive oxide film 245 formed at the sides of the conductive metal film pattern 241. Hence, it may be relatively easy to adjust the width of the LDD region. It may even be possible to form the LDD region having a width of about 2 μm or less, or better yet, a width of about 1 μm or less.

Further, a method of fabricating an active matrix flat panel display such as an active matrix liquid crystal display (LCD) and an active matrix organic electroluminescent display can be implemented using a thin film transistor with the foregoing GOLDD structure. Thus, this transistor may aid in providing an active matrix flat panel display.

As described above, the present invention discloses a thin film transistor with a GOLDD structure, a method of fabricating the same, and a flat panel display using the same. In these embodiments, a gate electrode may be formed of a conductive metal film pattern and a conductive oxide film. The conductive oxide film may be formed by oxidizing the conductive metal film pattern. This may result in an easily adjustable width of the LDD region. Additionally it may help to prevent defective alignment of the gate electrode.

While the present invention has been described with reference to particular embodiments, it must be understood that the disclosure has been made for purpose of illustrating the invention by way of examples and is not limited to limit the scope of the invention. One ordinarily skilled in the art can make changes to the disclosed embodiments without departing from the scope of the invention.

What is claimed is:

1. A thin film transistor, comprising:
    an active layer formed on an insulating substrate and having source/drain regions and a channel region;
    a gate insulating film formed on the active layer; and
    a gate electrode formed on the gate insulating film, and comprising a conductive film pattern and a conductive oxide film covering an upper surface of the conductive film pattern,
    wherein the source/drain regions comprise a lightly doped drain (LDD) region, and the LDD region overlaps with the gate electrode,
    wherein the conductive film pattern comprises at least one of a group of Zn, In, and any alloy thereof.

2. The thin film transistor of claim 1, wherein the conductive oxide film is formed by oxidizing the conductive film pattern.

3. The thin film transistor of claim 1, wherein the conductive oxide film is about 2 μm or less thick.

4. The thin film transistor of claim 1, wherein the conductive oxide film is about 1 μm or less thick.

5. The thin film transistor of claim 1, wherein the LDD region extends horizontally beneath a portion of the conductive oxide film formed at a side of the conductive film pattern.

6. The thin film transistor of claim 1, wherein the LDD region is narrower than the thickness of the conductive oxide film.

7. The thin film transistor of claim 1, wherein the LDD region is about 2 μm or less wide.

8. The thin film transistor of claim 1, wherein the LDD region is about 1 μm or less wide.

9. An active matrix flat panel display comprising a plurality of thin film transistors of claim 1 arranged to control the operation of a matrix of pixels.

10. The active matrix flat panel display of claim 9, wherein the flat panel display is a liquid crystal display or an organic electroluminescent display.

11. The thin film transistor of claim 1, wherein the conductive oxide film covers the upper surface of the conductive film pattern and a side surface of the conductive film pattern.

* * * * *